United States Patent
Yoneyama (10) Patent No.: US 8,366,862 B2
(45) Date of Patent: Feb. 5, 2013

(54) METHOD FOR FORMING STRUCTURE AND METHOD FOR MANUFACTURING LIQUID EJECTING HEAD

(75) Inventor: Hirono Yoneyama, Naka-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/140,374

(22) PCT Filed: Dec. 16, 2009

(86) PCT No.: PCT/JP2009/006911
§ 371 (c)(1),
(2), (4) Date: Jun. 16, 2011

(87) PCT Pub. No.: WO2010/070893
PCT Pub. Date: Jun. 24, 2010

(65) Prior Publication Data
US 2011/0308720 A1 Dec. 22, 2011

(30) Foreign Application Priority Data
Dec. 19, 2008 (JP) .................................. 2008-323789

(51) Int. Cl.
*B29C 59/16* (2006.01)
(52) U.S. Cl. ...................... 156/275.5; 264/447
(58) Field of Classification Search .................. 427/532; 156/272.2, 275.5; 264/447; 430/320, 326
See application file for complete search history.

(56) References Cited

U.S. PATENT DOCUMENTS

| 5,772,905 A | 6/1998 | Chou |
| 6,818,139 B1 | 11/2004 | Lee |
| 2007/0152372 A1 | 7/2007 | Chae |
| 2009/0189317 A1* | 7/2009 | Sato et al. ................. 264/447 |

FOREIGN PATENT DOCUMENTS

| EP | 1582923 A2 | 10/2005 |
| EP | 1854617 A1 | 11/2007 |
| JP | 2000-194142 A | 7/2000 |
| JP | 2004-304097 A | 10/2004 |
| JP | 2008-034412 A | 2/2008 |
| JP | 2008-226877 A | 9/2008 |

* cited by examiner

*Primary Examiner* — Daniel McNally
(74) *Attorney, Agent, or Firm* — Canon USA Inc IP Division (57) ABSTRACT

A method for forming a structure includes:
a step of forming on a substrate a resin layer composed of a resin which is cured by irradiation with active energy rays;
a step of pressing a first mold on the resin layer, the first mold being composed of an active energy ray-transmitting material and having projections each having an active energy ray-shielding film at the end thereof;
a first irradiation step of irradiating the resin layer;
a step of pressing a second mold on the resin layer within a region where the resin layer is not exposed to the rays, the second mold being composed of an active energy ray-transmitting material and having projections each having an active energy ray-shielding film at the end thereof; and
a second irradiation step of irradiating a portion of the unexposed region of the resin layer.

7 Claims, 6 Drawing Sheets

METHOD FOR FORMING STRUCTURE AND METHOD FOR MANUFACTURING LIQUID EJECTING HEAD

TECHNICAL FIELD

The present invention relates to a method for forming a structure and a method for manufacturing a liquid ejecting head.

BACKGROUND ART

A nano-imprint method having resolution not restricted by the limits of conventional machining and photolithography attracts attention as a method for forming a micro three-dimensional structure.

For example, U.S. Pat. No. 5,772,905 discloses the following nano-imprint method. As described below, first, a substrate on a surface of which a thin film of a thermoplastic resin such as polymethyl methacrylate (PMMA) or the like is formed, and a mold on which a micro recess/projection pattern is formed are prepared. Next, the mold is pressed on the thermoplastic resin softened by heating the substrate to the glass transition temperature or more. Then, the mold is released from the thermoplastic resin solidified by cooling to the glass transition temperature or less. Consequently, a reverse pattern of the micro pattern of the mold is formed in the thermoplastic resin.

On the other hand, as a nano-imprint method using a substrate on a surface of which a thin film of active energy ray-curable resin is formed, Japanese Patent Laid-Open No. 2000-194142 discloses the following method. For example, a mold composed of an active energy ray-transmitting material, such as quartz or the like, and having a micro recess/projection pattern formed thereon is prepared. Next, the mold is pressed on the active energy ray-curable resin layer formed on the substrate, active energy rays are applied through the substrate to cure the active energy ray-curable resin, and then the mold is released. Consequently, a reverse pattern of the micro pattern of the mold is formed in the active energy ray-curable resin layer.

As described above, the nano-imprint method requires preparation of a mold on which a desired pattern is formed. Methods for forming the mold include a method of forming a silicon, Ni, or quartz mold using exposure and development technique, and etching technique, and the like.

However, in order to prepare a micro three-dimensional structure mold having a plurality of steps, it is necessary to repeat etching. Therefore, it is difficult to keep the depth and height of a recess/projection pattern constant and maintain the shape of an edge, and when quartz which is an active energy ray-transmitting material is used, it is difficult to prepare a mold with high precision because micro trenches occur.

Therefore, there is a conceivable method for forming a micro three-dimensional structure by a plurality of times of pressing using a plurality of molds each having one-step projections. However, a thermal imprint method as in the above Patent Literature 1 requires a high-temperature press process. Therefore, when a substrate having a certain pattern formed thereon is again heated to the glass transition temperature or more and pressed, the pattern formed in a thermoplastic resin by pressing is softened, thereby failing to maintain the shape. Therefore, in the thermal imprint method, it is difficult to form a micro three-dimensional structure with high precision by a plurality of times of pressing using a plurality of molds.

On the other hand, as a non-heating pressing method, U.S. Pat. No. 6,818,139 discloses a method in which a porous structure is formed in a thermoplastic resin on a substrate, and imprinting is performed at the glass transition temperature or less.

As described above, as a non-heating method for forming a micro three-dimensional structure by a plurality of times of pressing using a plurality of molds each including one-step projections, there is a known method in which a porous structure is formed in a thermoplastic resin on a substrate, and imprinting is performed at the glass transition temperature or less. However, when this method is used, the porous material decreases at each time of pressing, and thus pressing force is not absorbed and the influence on the periphery of a pattern to be pressed cannot be neglected, thereby possibly breaking the pattern pressed in the thermoplastic resin.

Therefore, in a room-temperature imprint method using a thermoplastic resin having a porous structure formed therein, it is difficult to form a micro three-dimensional structure by a plurality of times of pressing using a plurality of molds.

SUMMARY OF INVENTION

The present invention provides a method for precisely forming a structure having a step difference by pressing.

As an example of the present invention, a method for forming a structure includes the following steps: a step of forming on a substrate a resin layer composed of a resin which is cured by irradiation with active energy rays; a step of pressing a first mold in a direction from the upper surface of the resin layer to the substrate, the first mold being composed of an active energy ray-transmitting material and having projections which are provided on a surface of the first mold and each of which has an active energy ray-shielding film at the end thereof; a first irradiation step of irradiating the resin layer with active energy rays transmitted through the first mold; a step of curing a portion of the resin layer irradiated with the active energy rays; a step of removing the first mold; a step of pressing a second mold in a direction from the upper surface of the resin layer to the substrate within a region where the resin layer is not exposed to the rays, the second mold being composed of an active energy ray-transmitting material and having projections which are provided on a surface of the second mold and each of which has an active energy ray-shielding film at the end thereof; a second irradiation step of irradiating a portion of the unexposed region of the resin layer with active energy rays transmitted through the second mold, an exposed portion being cured in the second irradiation step; a step of removing the second mold.

The method for forming a micro three-dimensional structure according to the present invention is capable of forming a micro three-dimensional structure by a plurality of times of pressing using a plurality of molds because an uncured resin is surrounded by a cured resin, thereby suppressing the influence on a periphery of a pattern to be pressed.

DESCRIPTION OF EMBODIMENTS

Embodiments of the present invention are described on the basis of the attached drawings.

Figure 1:
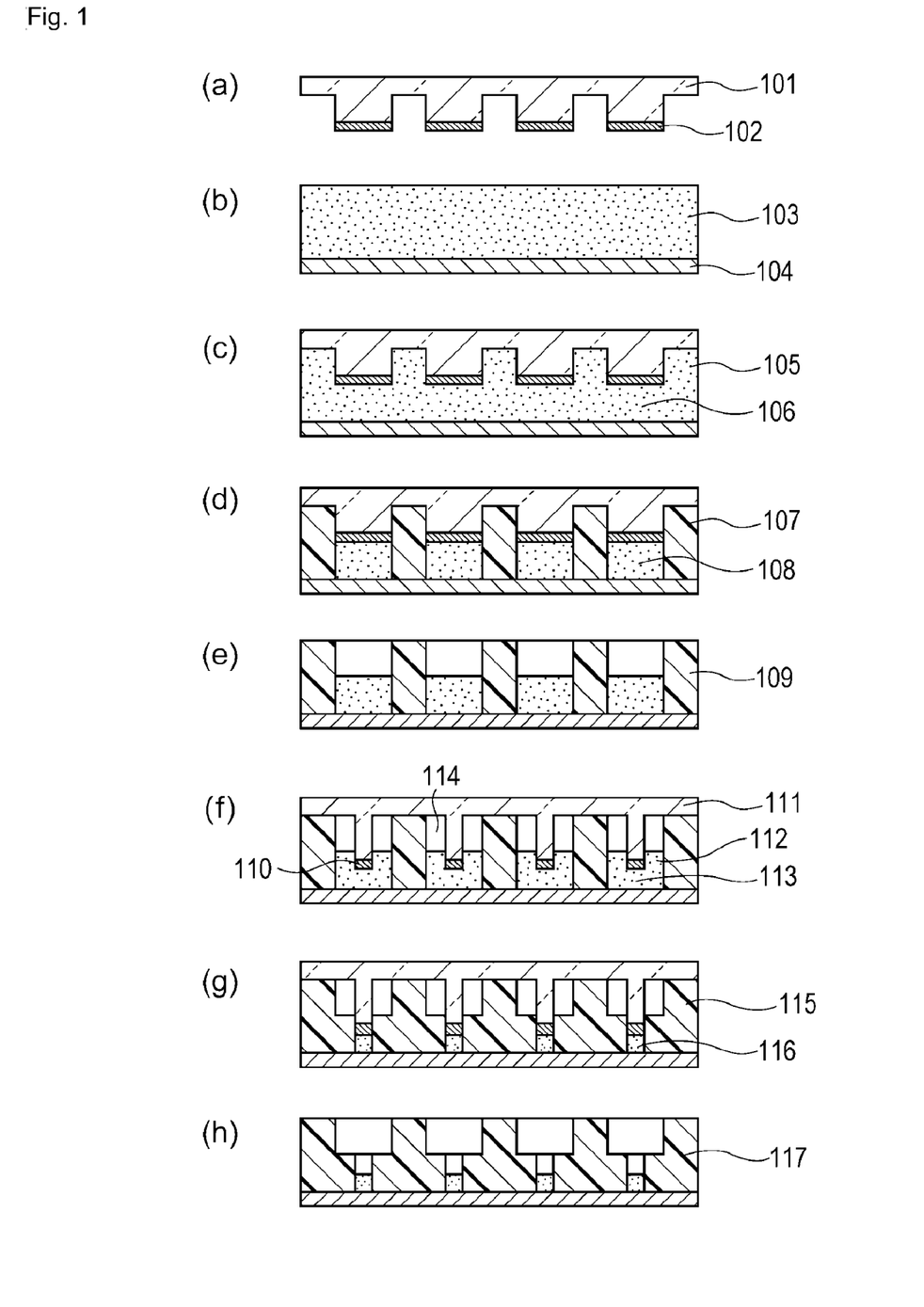
FIG. 1 is a drawing showing a method for forming a micro three-dimensional structure according to a preferred embodiment of the present invention.
Figure 2:
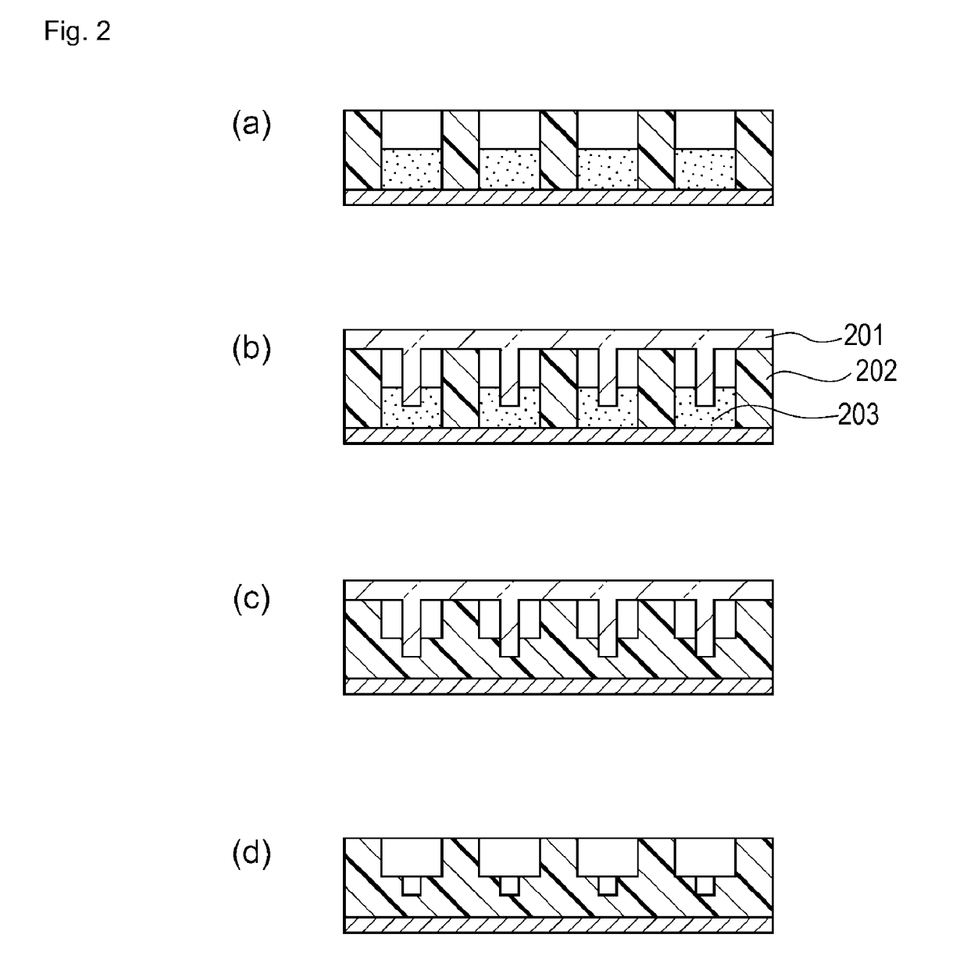
FIG. 2 is a drawing showing a method for forming a micro three-dimensional structure according to a preferred embodiment of the present invention.
Figure 3:
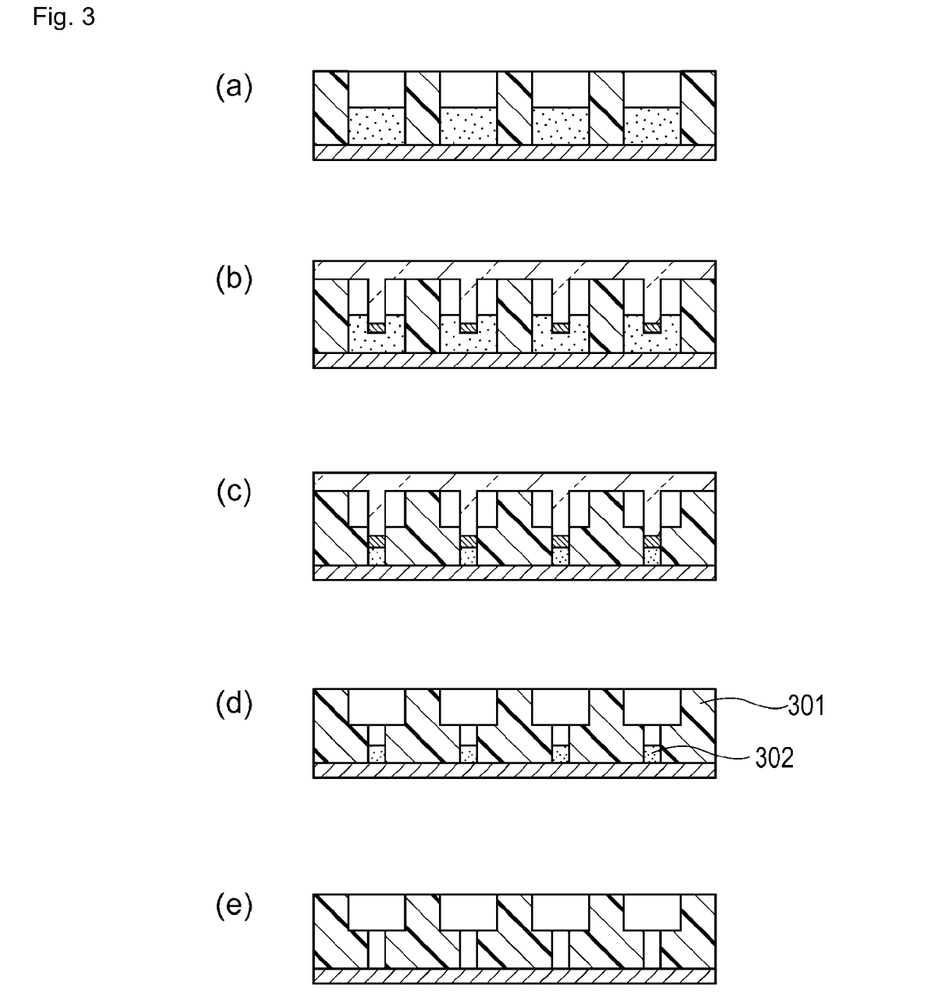
FIG. 3 is a drawing showing a method for forming a micro three-dimensional structure according to a preferred embodiment of the present invention.

FIG. 1 is a schematic drawing showing a method for forming a micro three-dimensional structure using an imprint mold according to an embodiment of the present invention.

As shown in FIG. 1(a), first, a first mold 101 is prepared, in which projections are formed on a surface, and active energy ray-shielding films 102 are formed on the projections. The projections formed in the first mold 101 may be one-step projections. The first mold 101 is composed of an active energy ray-transmitting material, for example, quartz. The active energy ray-shielding film 102 is composed of a material which intercepts transmission of active energy rays, for example, chromium (Cr).

On the other hand, as shown in FIG. 1(b), a substrate 104 coated with a resin layer 103 composed of an active energy ray-curable resin is prepared. The active energy ray-curable resin is preferably used as a solution of the resin, which is solid at room temperature, in a solvent in order to prevent an uncured resin below the active energy ray-shielding film from separating together with the mold during mold release, and is, for example, SU-8 (trade name, manufactured by Kayaku Microchem Co., Ltd.). In addition, the substrate 104 may be any substrate which has strength sufficient to prevent deformation during pressing and smoothness lower than that of a recess/projection structure of a mold, and is composed of, for example, silicon (Si).

Next, as shown in FIG. 1(c), the first mold 101 is pressed on the resin layer 103 with appropriate force. As a result, the resin layer 103 is deformed to form recesses 106 corresponding to the respective projections of the first mold and residual projections 105. In this process, the resin layer 103 and the substrate 104 may be heated for decreasing pressing force.

Next, as shown in FIG. 1(d), in the state in which the first mold 101 is pressed on the resin layer 103, active energy rays are applied through the first mold 101. Since the first mold 101 is composed of a material which transmits active energy rays, the active energy rays applied are transmitted through the first mold 101 and applied to the resin layer 103. However, the active energy ray-shielding film 102 is composed of a material which shields active energy rays, and thus the recesses 106 of the resin layer 103 are not irradiated with the active energy rays. Therefore, in irradiation with active energy rays, the projections 105 of the resin layer 103 become cured regions 107 in which the active energy-curable resin is cured, and the recesses 106 of the resin layer 103 become uncured regions 108 in which the active energy-curable resin is not crosslinked. That is, a resin layer 109 in which the uncured regions 108 are surrounded by the cured regions 107 is formed.

Next, as shown in FIG. 1(e), the first mold 101 is released from the resin layer 109. It is preferred to sufficiently cool the resin layer 109 before mold release. In addition, the active energy ray-curable resin may be insufficiently cured only by irradiation with active energy rays depending on the active energy ray-curable resin used. In this case, the resin may be sufficiently cured by heating in the state in which the first mold 101 is pressed or immediately after the first mold 101 is released.

Next, as shown in FIG. 1(f), a second mold 111 is pressed on the resin layer 109 with appropriate force. Since the second mold 111 is composed of an active energy ray-transmitting material, for example, quartz. In the second mold 111, projections are formed on a surface, and an active energy ray-shielding film 110 is formed on the projections. The projections formed in the second mold 111 may be one-step projections. The active energy ray-shielding film 110 is composed of a material which intercepts transmission of active energy rays, for example, chromium (Cr). As a result, the uncured regions 108 are deformed to form recesses 113 corresponding to the respective projections of the second mold and residual projections 112. In this process, the resin layer 109 and the substrate 104 may be heated for decreasing pressing force.

In addition, since the projections 105 formed using the first mold 101 are cured by irradiation with active energy rays, the shape is not broken even by pressing the second mold 111. Further, since the uncured regions 108 are surrounded by the cured regions 107, the resin pushed by the mold may rise in the spaces 114 between the second mold 111 and the resin layer 109. However, when the uncured regions 108 have a volume sufficient for the second mold 111 in the direction vertical to the drawing, displacement of the resin surfaces in the spaces 114 between the second mold 111 and the resin layer 109 is very small.

The second mold 111 has a pattern finer than the uncured regions 108 to be pressed. That is, the area of each of the projections 110 formed on the second mold 111 is smaller than that of each of the uncured regions 108.

Next, as shown in FIG. 1(g), in the state in which the second mold 111 is pressed on the uncured regions 108, active energy rays are applied through the second mold 111. Since the second mold 111 is composed of a material which transmits active energy rays, the active energy rays applied are transmitted through the second mold 111 and applied to the resin layer 109. However, the active energy ray-shielding film 110 is composed of a material which intercepts active energy rays, and thus the recesses 113 of the uncured regions 108 are not irradiated with the active energy rays. Therefore, in irradiation with active energy rays, the projections 112 of the uncured regions 108 become cured regions 115 in which the active energy-curable resin is cured, and the recesses 113 of the uncured regions 108 become uncured regions 116 in which the active energy-curable resin is not crosslinked. That is, a resin layer 117 in which the uncured regions 116 are surrounded by the cured regions 115 is formed.

Next, as shown in FIG. 1(h), the second mold 111 is released from the resin layer 117. It is preferred to sufficiently cool the resin layer 117 before mold release. In addition, the active energy ray-curable resin may be insufficiently cured only by irradiation with active energy rays depending on the active energy ray-curable resin used. In this case, the resin may be sufficiently cured by heating in the state in which the second mold 111 is pressed or immediately after the second mold 111 is released. Consequently, a two-step micro three-dimensional structure can be formed using two molds each including one-step projections.

According to an embodiment of the present invention, a desired micro three-dimensional structure may be formed by repeating the steps shown in FIGS. 1(c) to 1(h) (n−2) times using a nth mold (n is an integer of 3 or more). The projections formed on the nth mold may be one-step projections. Therefore, a micro three-dimensional structure with three or more steps can be formed using three or more molds each including one-step projections.

According to an embodiment of the present invention, the steps shown in FIGS. 2(a) to 2(d) may be performed in place of the steps 1(e) to 1(h). Namely, a mold 201 without an active energy ray-shielding film is used as a final mold so that the resin in uncured regions 203 surrounded by cured regions 202 may be cured by irradiating the entire surface with active energy rays.

According to an embodiment of the present invention, the steps shown in FIGS. 3(a) to 3(e) may be performed in place of the steps shown in FIGS. 1(e) to 1(h). Namely, after the final mold is released, a resin in uncured regions 302 surrounded by cured regions 301 may be removed by development. In addition, in the state shown in FIG. 1(h), the resin in the uncured regions 116 surrounded by the cured regions 115 may be cured by irradiating the whole surface with active energy rays.

A method for manufacturing a liquid ejecting head according to an embodiment of the present invention is described. A liquid ejecting head is an apparatus which ejects a liquid by applying thermal energy to the liquid to generate bubbles.

Figure 4:
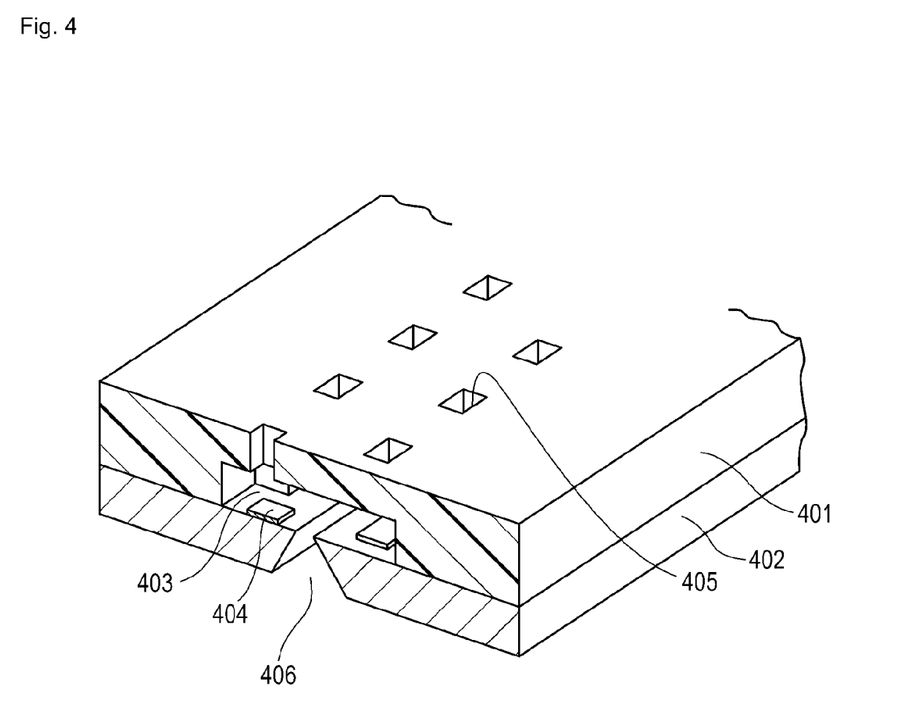
FIG. 4 is a drawing showing a configuration of a liquid ejecting head.

A configuration of a liquid ejecting head is shown in FIG. 4. The liquid ejecting head includes a passage forming member 401 and a substrate 402. The passage forming member 401 includes ejection ports 405 for ejecting a liquid and liquid passages 403 each communicated with the ejection port 405 at the end and having a region for generating bubbles. The substrate 402 includes liquid ejection energy generating elements 404 and a liquid supply port 406 formed to communicate with the liquid passages 403.

Figure 5:
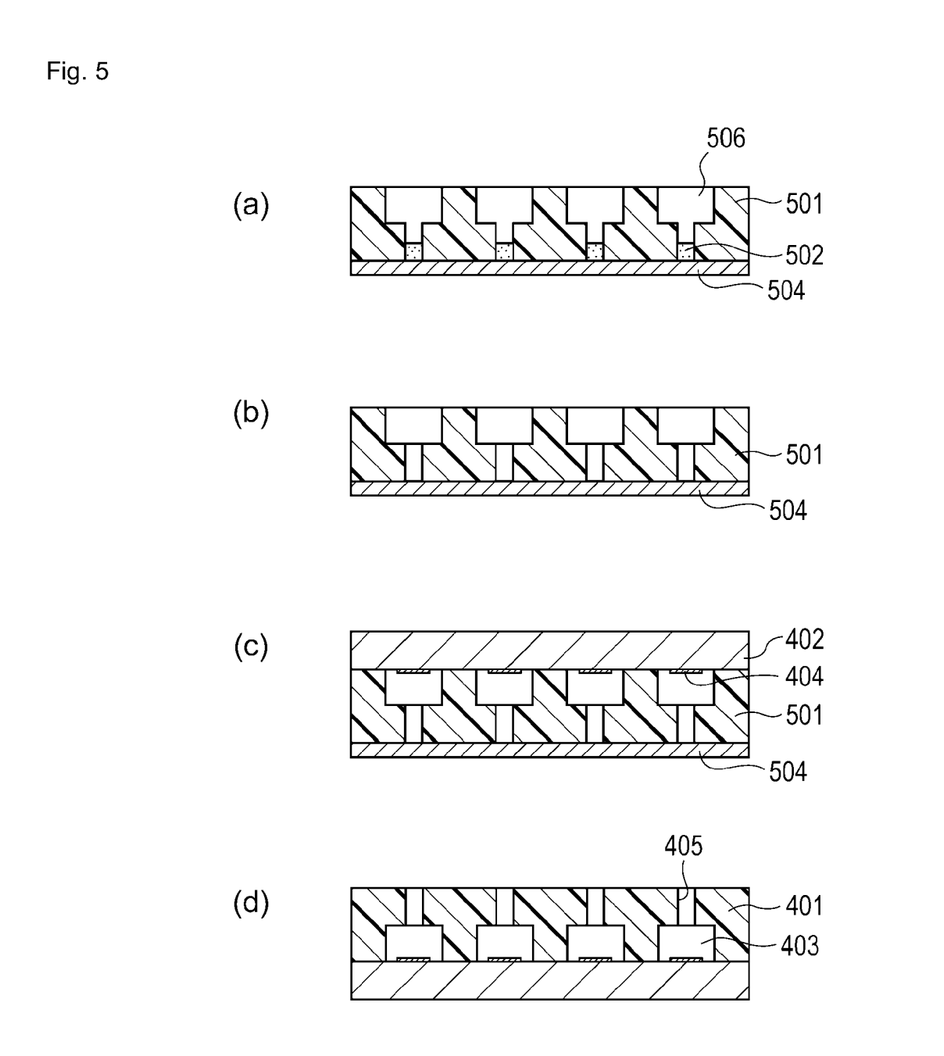
FIG. 5 is a drawing showing a method for manufacturing a liquid ejecting head according to a preferred embodiment of the present invention.

When a liquid ejecting head is manufactured according to an embodiment of the present invention, the steps shown in FIG. 5 can be applied after the steps shown in FIGS. 1(e) to 1(h). FIG. 5 shows the same section as FIG. 1. The state shown in FIG. 1(h) corresponds to the state shown in FIG. 5(a). Cured portions 501 formed by repeating pressing and curing and uncured portions 502 surrounded by the cured portions 501 are removed to create a state shown in FIG. 5(b). Then, the substrate 402 having the energy generating elements 404 formed thereon is bonded to the upper surfaces of the cured portions 501 (FIG. 5(c)), and then the substrate 504 is separated. Consequently, portions in which the uncured portions 502 are removed become the ejection ports 405, and the cured portions 501 form the passage forming member 401 having the passages 403 (FIG. 5(d)).

Figure 6:
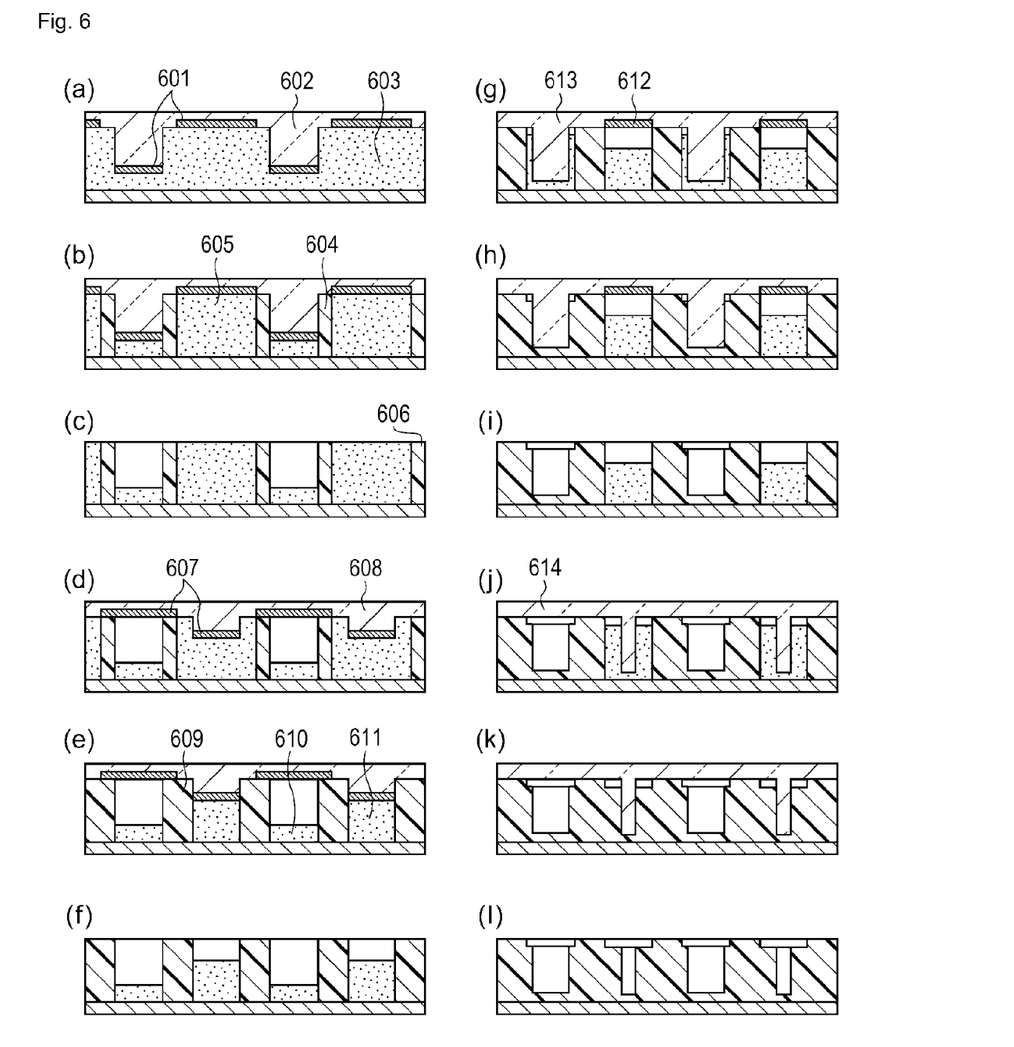
FIG. 6 is a drawing showing a method for forming a micro three-dimensional structure according to another preferred embodiment of the present invention.

FIG. 6 is a schematic drawing showing a method for forming a micro three-dimensional structure using an imprint mold according to another embodiment of the present invention. This method is effective for a case in which a desired pattern is nonuniform within an imprint plane and step differences at the same height are formed by repeating pressing a plurality of times. The same portions as in the above-described embodiments are not described.

First, as shown in FIG. 6(a), a first mold 602 provided with active energy ray-shielding films 601 and composed of an active energy ray-transmitting material is pressed with appropriate force on a resin layer 603 formed on a substrate and composed of an active energy ray-curable resin. The active energy ray-shielding films 601 are formed not only on projections of the mold 602 but also on portions of recesses thereof as shown in FIG. 6(a).

Next, as shown in FIG. 6(b), in the state in which the first mold 602 is pressed on the resin layer 603, active energy rays are applied through the first mold 602. However, all projections of the resin layer 603 are not irradiated with the active energy rays, but portions corresponding to the regions in which the active energy ray-shielding films 601 are formed in the recesses of the first mold 602 remain as uncured regions without being irradiated. As a result, a resin layer 606 is formed, in which uncured regions 605 are surrounded by cured regions 604.

Next, as shown in FIG. 6(c), the first mold 602 is released from the resin layer 606.

Next, as shown in FIG. 6(d), a second mold 608 provided with active energy ray-shielding films 607 and composed of an active energy ray-transmitting material is pressed with appropriate force on the resin layer 606. The second mold 608 has an aspect ratio different from that of the first mold 602. The active energy ray-shielding films 607 are formed not only on projections of the second mold 608 but also on portions of recesses thereof as shown in FIG. 6(d).

Next, as shown in FIG. 6(e), in the state in which the second mold 608 is pressed on the uncured regions 605, active energy rays are applied through the second mold 608. However, all projections of the resin layer 603 are not irradiated with the active energy rays, but portions corresponding to the regions in which the active energy ray-shielding films 607 are formed in the recesses of the second mold 608 remain as uncured regions without being irradiated. As a result, a resin layer 606 is formed, in which recesses 610 which are uncured regions with a larger surface height and recesses 611 which are uncured regions with a smaller surface height are formed, the recesses 610 and 611 being surrounded by cured regions 609.

Next, as shown in FIG. 6(f), the second mold 608 is released from the resin layer.

At this time, the heights of the recesses 610 and 611 as uncured regions are controlled. That is, since the volume of the resin pushed away by a mold is equal to the volume of the resin rising in the spaces between the mold and the resin, the heights are controlled so that the heights of the resin rising when each of third and fourth molds is pressed are equal.

Next, as shown in FIG. 6(g), a third mold 613 composed of an active energy ray-transmitting material and provided with active energy ray-shielding films 612 is pressed with appropriate force on the resin layer. The active energy ray-shielding films 612 are formed on portions of recesses of the third mold 613 and not formed on projections thereof, as shown in FIG. 6(g). As a result, the resin in the recesses 610 is pressed and pushed to be formed in a desired shape.

Next, as shown in FIG. 6(h), in the state in which the third mold 613 is pressed on the recesses 610, active energy rays are applied through the third mold 613. As a result, the resin in the recesses 610 is cured to form a desired structure.

Next, as shown in FIG. 6(i), the third mold 613 is released from the resin layer.

Next, as shown in FIG. 6(j), a fourth mold 614 composed of an active energy ray-transmitting material is pressed with appropriate force on the resin layer. The fourth mold 614 has a smaller recess volume than that in the third mold 613. In addition, active energy ray-shielding films are not formed on the fourth mold 614 as shown in FIG. 6(j). As a result, the resin in the recesses 611 is pressed and pushed to be formed in a desired shape.

Next, as shown in FIG. 6(k), in the state in which the fourth mold 614 is pressed on the recesses 611, active energy rays are applied through the fourth mold 614. As a result, the resin in the recesses 611 is cured to form a desired structure.

Next, as shown in FIG. 6(l), the fourth mold 614 is released.

Through the above-described steps, as shown in FIG. 6, a desired pattern is nonuniform within an imprinting plane and step differences at equal heights can be formed by repeating pressing a plurality of times. However, the uncured regions surrounded by the cured regions formed using the first and second molds may be uncured regions at different heights or uncured regions with different surface areas.

In addition, the number of the molds used and the number of times of pressing are not limited to the above. The order of use of the molds used is not limited to the above, and for example, the order of use of the first and second molds may be reversed. In addition, uncured regions formed using a mold provided with active energy ray-shielding films may be removed by development.

EXAMPLE

Although an example of the present invention is described below, the present invention is not limited to this example.

Although, in each of the embodiments, active energy rays are UV rays, the active energy rays are not necessarily limited to this, and active energy rays other than UV rays may be used. Here, the active energy rays include electromagnetic waves, such as electron rays, X-rays, visible rays, infrared rays, heat rays, and the like.

Example 1

In Example 1, a method for forming a micro three-dimensional structure to which the present invention is applied is described.

First, SU-8 3000 (trade name, manufactured by Kayaku Microchem Co., Ltd.) was distilled with a solvent and applied to 5 micrometers on a Si substrate by spin coating.

On the other hand, Al was deposited on a quartz substrate by sputtering, and positive resist OFPR-800 (trade name, manufactured by Tokyo Ohka Kogyo Co., Ltd.) was applied to the surface on which an Al film was formed. Then, the Al film and quartz were etched by 1 micrometer by exposure and development using a line-and-space mask with a pitch of 10 micrometers (first mold). In addition, a quartz substrate on which another Al film and OFPR-800 (trade name, manufactured by Tokyo Ohka Kogyo Co., Ltd.) were formed was subjected to exposure and development using a circular mask having a diameter of 5 micrometers to etch the Al film and quartz by 3 micrometers (second mold). Further, a quartz substrate on which only OFPR-800 (trade name, manufactured by Tokyo Ohka Kogyo Co., Ltd.) was applied was subjected to exposure and development using a circular mask having a diameter of 3 micrometers to etch quartz by 4 micrometers (third mold). Then, OFPR-800 (trade name, manufactured by Tokyo Ohka Kogyo Co., Ltd.) used as a resist was separated to complete each of the molds.

Next, the Si substrate on which a layer of SU-8 3000 (trade name, manufactured by Kayaku Microchem Co., Ltd.) was formed was heated to 100 degrees Celsius, and the first mold provided with the active energy ray-shielding films composed of Al and formed at the ends of projections with a pitch of 10 micrometers and a height of 1 mlcrometer was pressed at 1 MPa. The first mold pressed was maintained for 1 minute, and then UV rays were applied from the first mold side, followed by further baking at 100 degrees Celsius for 4 minutes. Then, the first mold was released, and alignment was performed for recesses of the resin. Next, the second mold provided with the active energy ray-shielding films composed of Al and formed at the ends of projections with a diameter of 5 micrometers and a height of 3 micrometers was pressed at 1 MPa. The second mold pressed was maintained for 1 minute, and then UV rays were applied from the second mold side, followed by further baking at 100 degrees Celsius for 4 minutes. Then, the second mold was released, and alignment was performed for lowest recesses of the resin. Next, the third mold having projections with a diameter of 2 mlcrometers and a height of 4 micrometers was pressed at 1 MPa. The third mold pressed was maintained for 1 minute, and then UV rays were applied to the entire surface from the third mold side to cure the resin. The third mold was further baked at 100 degrees Celsius for 4 minutes while being pressed, and then the third mold was released. Finally the resin was completely cured by heat treatment at 200 degrees Celsius for 1 hour.

As described above, a micro three-dimensional structure including a three-step structure was formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-323789, filed Dec. 19, 2008, which is hereby incorporated by reference herein in its entirety.

The invention claimed is:

1. A method for forming a structure comprising:
a step of forming on a substrate a resin layer composed of an activation energy ray curable resin;
a step of pressing a first mold in a direction from the upper surface of the resin layer to the substrate, the first mold being composed of an active energy ray-transmitting material and having projections which are provided on a surface thereof and each of which has an active energy ray-shielding film;
a first irradiation step of irradiating the resin layer with active energy rays transmitted through the first mold;
a step of curing a portion of the resin layer irradiated with the active energy rays;
a step of removing the first mold;
a step of pressing a second mold in a direction from the upper surface of the resin layer to the substrate within a region where the resin layer is not exposed to the rays, the second mold being composed of an active energy ray-transmitting material and having projections which are provided on a surface thereof and each of which has an active energy ray-shielding film;
a second irradiation step of irradiating a portion of the unexposed region of the resin layer with active energy rays transmitted through the second mold, an exposed portion being cured in the second irradiation step; and
a step of removing the second mold.

2. The method according to claim 1, wherein the projections formed on the first mold are one-step projections.

3. The method according to claim 1, wherein the projections formed on the second mold are one-step projections.

4. The method according to claim 1, wherein uncured portions in the resin layer are removed by development.

5. A method for manufacturing a liquid ejecting head including a substrate provided with an energy generating element which generates energy used for ejecting a liquid from an ejection port and a passage wall provided on the substrate and communicated with the ejection port, the method comprising:

preparing a structure formed by the method according to claim 1; and bonding the energy generating element side of the substrate and a structure.

6. The method according to claim 1, wherein the active energy ray-shielding film of the projections of the first mold is provided at an end of the projections of the first mold.

7. The method according to claim 1, wherein the active energy ray-shielding film of the projections of the second mold is provided at an end of the projections of the second mold.

* * * * *